United States Patent
Jang et al.

[11] Patent Number: 5,940,719
[45] Date of Patent: Aug. 17, 1999

[54] METHOD FOR FORMING ELEMENT ISOLATING FILM OF SEMICONDUCTOR DEVICE

[75] Inventors: Se Aug Jang; Tae Sik Song; Young Bog Kim; Byung Jin Cho; Jong Choul Kim, all of Kyoungki-do, Rep. of Korea

[73] Assignee: Hyundai Electronics Industries Co., Ltd., Kyoungki-do, Rep. of Korea

[21] Appl. No.: 08/837,977

[22] Filed: Apr. 14, 1997

[30] Foreign Application Priority Data

Apr. 22, 1996 [KR] Rep. of Korea ............... 96-12197

[51] Int. Cl.⁶ ..................................... H01L 21/76
[52] U.S. Cl. .............................. 438/443; 438/445
[58] Field of Search ................ 438/445, FOR 232, 438/443, 452, FOR 229; 148/DIG. 85, DIG. 86

[56] References Cited

U.S. PATENT DOCUMENTS

| 4,561,172 | 12/1985 | Slawinski et al. . |
| 4,583,281 | 4/1986 | Ghezzo et al. . |
| 5,139,964 | 8/1992 | Onishi et al. . |
| 5,246,537 | 9/1993 | Cooper et al. . |
| 5,374,584 | 12/1994 | Lee et al. . |

FOREIGN PATENT DOCUMENTS

| 63-87742 | 4/1988 | Japan . |
| 63-299 144 | 9/1988 | Japan . |
| 5-021 595 | 1/1993 | Japan . |
| 5-198 570 | 8/1993 | Japan . |
| 6-283 522 | 10/1994 | Japan . |
| 8-031 811 | 2/1996 | Japan . |
| 83 109 340 | 9/1995 | Taiwan . |
| 2 306 780 | 5/1997 | United Kingdom . |

OTHER PUBLICATIONS

Ghandhi, S. , VLSI Fabrication Priciples: Silicon and Gallium Arsenide, John Wiley and Sons, pp. 517–520, 1983.
Wolf, S., et al, Silicon Processing for the VSLI Era:vol. 1, Process Technology, Lattice Press, pp. 439–414, 1986.

*Primary Examiner*—George R. Fourson
*Attorney, Agent, or Firm*—Thelen Reid & Priest LLP

[57] ABSTRACT

A method for forming an element isolating film of a semiconductor device, which is capable of achieving a reduction in topology and a reduction in the occurrence of a bird's beak phenomenon, so that subsequent processes can be easily carried out to fabricate highly integrated semiconductor devices. The method includes the steps of sequentially forming a pad oxide film and a first nitride film over a semiconductor substrate, over-etching the first nitride film and the pad oxide film by use of an element isolating mask, thereby forming a first hole in the semiconductor substrate, cleaning the entire upper surface of the resulting structure by use of an etch solution, forming second-nitride film spacers on side walls of the selectively etched first nitride film, pad oxide film and first hole, forming a second hole in the first hole of the semiconductor substrate by use of the first nitride film and second-nitride film spacers as a mask, thermally oxidizing the surface of the second hole, thereby forming a thermal oxide film, and removing the first nitride film, pad oxide film and second-nitride film spacers, thereby forming an element isolating film.

7 Claims, 8 Drawing Sheets

METHOD FOR FORMING ELEMENT ISOLATING FILM OF SEMICONDUCTOR DEVICE

BACKGROUND OF THE INVENTION

1. Field of the Invention

The present invention relates to a method for fabricating semiconductor devices, and more particularly to a method for forming an element isolating film appropriate for the fabrication of highly integrated semiconductor devices.

2. Description of the Prior Art

Typically, a semiconductor device is defined with active regions, on which individual elements are formed, and element isolating regions each serving to isolate adjacent active regions from each other.

Element isolating regions of such a semiconductor device electrically and structurally isolate individual elements constituting the semiconductor device from one another so that those elements can perform given functions without being affected by elements adjacent thereto.

In order to obtain a highly integrated semiconductor device, it is necessary to not only reduce the size of elements constituting the semiconductor device, but also to reduce the width and area of element isolating regions, namely, the width and area of an element isolating insulating film.

In this regard, element isolation techniques are techniques for determining memory cell size.

Element isolation techniques at the early development stage are those using a junction isolation method for the fabrication of bipolar integrated devices.

At present, element isolation techniques are those using a local oxidation of silicon (LOCOS) method, which is an insulator isolating method, and those using a trenching method, which is an insulator burying method, for the fabrication of MOS IC's, namely, LSI's and VLSI's.

The LOCOS method is for isolating adjacent elements by forming a thick element isolating insulating film between adjacent active regions defined on a semiconductor substrate using an insulating film, such as a silicon nitride film, as a mask.

A conventional method for forming an element isolating film of a semiconductor device in accordance with the LOCOS method will be described in conjunction with FIGS. 1 to 4.

FIGS. 1 to 4 are sectional views respectively illustrating sequential steps of the method for forming an element isolating film in accordance with the LOCOS method.

Figure 1:
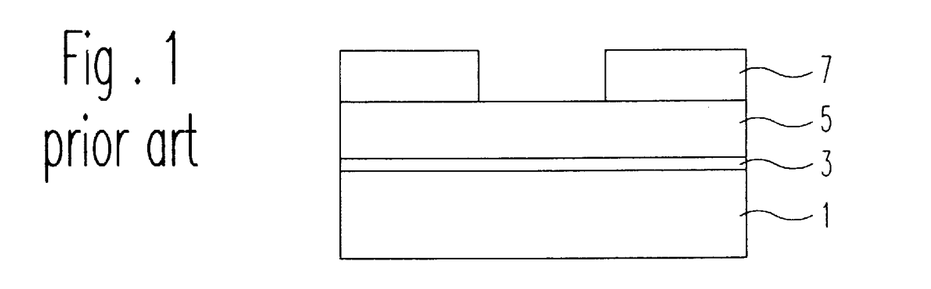
FIGS. 1 to 4 are sectional views respectively illustrating sequential steps of a conventional method for forming an element isolating film of a semiconductor device.

In accordance with this method, a pad oxide film 3 and a nitride film 5 are first formed to desired thicknesses over a semiconductor substrate 1 in a sequential manner, as shown in FIG. 1.

A photoresist film pattern 7 is then formed on the nitride film 5 to define an element isolating region.

Figure 2:
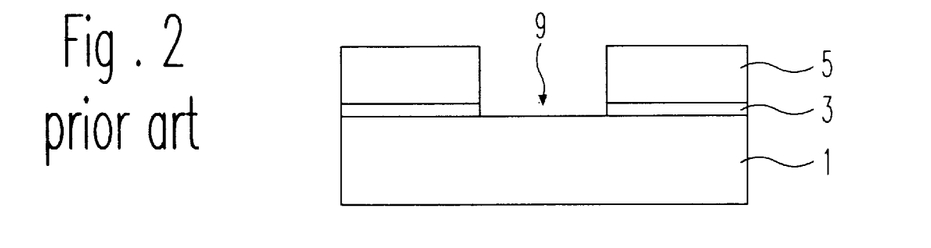

Thereafter, the nitride film 5 and pad oxide film 3 are etched using the photoresist film pattern 7 as a mask, as shown in FIG. 2. The photoresist film pattern 7 is then removed, thereby forming a contact hole 9 exposing a portion of the semiconductor substrate 1 corresponding to a field region on which an element isolating insulating film will be formed.

Figure 3:
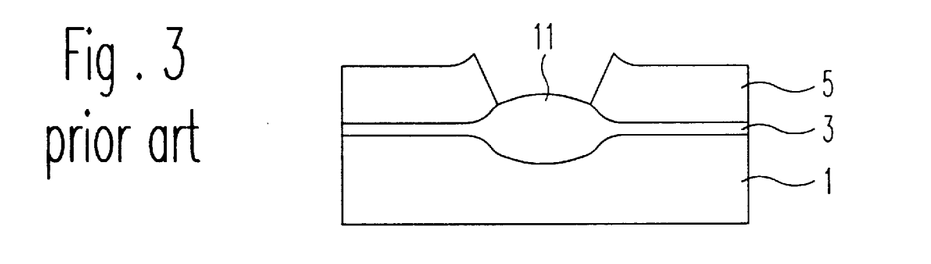

The resulting structure is then subjected to a thermal oxidation process, namely, a field oxidation process. That is, a thermal oxide film 11 is formed on the portion of the semiconductor substrate 1 exposed through the contact hole 9, as shown in FIG. 3.

At this time, the nitride film 5 is partially lifted at its edges due to the growth of the thermal oxide film 11.

Subsequently, the nitride film 5 and pad oxide film 3 are completely removed. Thus, an element isolating insulating film 13 is formed, as shown in FIG. 4.

Figure 4:
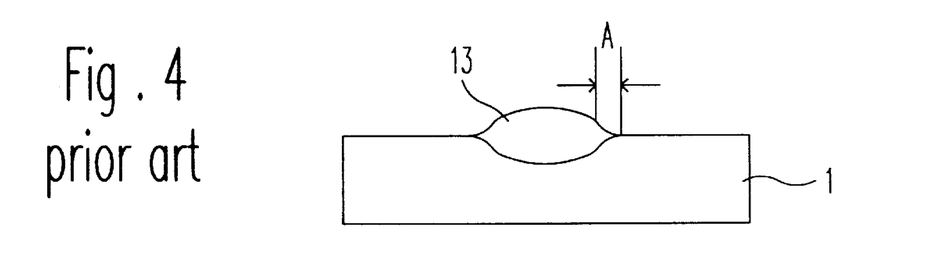

Referring to FIG. 4, it can be found that the element isolating insulating film 13 has elongated bird's beaks A at its edges.

However, the above-mentioned element isolating film forming method has the following problems.

In accordance with the above-mentioned conventional method, the portion of the element isolating insulating film buried in the semiconductor substrate has a volume ratio (thickness ratio) of only about 50%. This results in a low punch-through voltage and a deteriorated planarization. As a result, there is difficulty in performing subsequent processes.

In accordance with the conventional method, a bird's beak phenomenon occurs in the thermal oxidation process. That is, the edge portion of the element isolating insulating film penetrates active regions. This results in a reduction in the area of active regions. As a result, it is difficult to achieve a high integration of the semiconductor device.

Where a channel stopper is provided by injecting ions between adjacent element isolating insulting films to prevent a reduction in punch-through voltage between adjacent active regions, an increase in junction leakage current occurs. This results in a reduction in channel width. Consequently, there is a degradation in the electrical characteristic and reliability of the semiconductor device.

In accordance with the conventional method, the element isolating insulating film protrudes from the semiconductor substrate, thereby forming steps. As a result, an irregular reflection of light occurs in a subsequent lithography process, thereby generating a notching phenomenon. That is, a bad pattern is formed because the pattern is partially lost. This results in a deterioration in the operation characteristic and reliability of the semiconductor device. Consequently, process yield is reduced.

SUMMARY OF THE INVENTION

An object of the invention is to eliminate the above-mentioned problems involved in the prior art and to provide a method for forming an element isolating film of a semiconductor device, which is capable of achieving a reduction in topology and a reduction in the occurrence of a bird's beak phenomenon, so that subsequent processes can be easily carried out to fabricate highly integrated semiconductor devices.

Another object of the invention is to provide a method for forming an element isolating film of a semiconductor device, which is capable of achieving a complete isolation of elements of the semiconductor device, thereby improving the electrical characteristic, operation characteristic, reliability and yield of the semiconductor device.

In accordance with one aspect of the present invention, a method for forming an element isolating film of a semiconductor device is provided and comprises the steps of: preparing a semiconductor substrate; sequentially forming a pad oxide film and a first nitride film over the semiconductor substrate; over-etching the first nitride film and the pad oxide film by use of an element isolating mask, thereby forming a first hole in the semiconductor substrate; cleaning the entire upper surface of the resulting structure by use of an etch solution; forming second-nitride film spacers on side walls of the selectively etched first nitride film and pad oxide film and the first hole; forming a second hole in the first hole of the semiconductor substrate by use of the first nitride film and second-nitride film spacers as a mask; thermally oxidizing the surface of the second hole, thereby forming a thermal oxide film; and removing the first nitride film, pad oxide film and second-nitride film spacers, thereby forming an element isolating film.

In accordance with another aspect of the present invention, a method for forming an element isolating film of a semiconductor device is provided and comprises the steps of: preparing a semiconductor substrate; sequentially forming a pad oxide film, a first nitride film and an anti-reflection film over the semiconductor substrate; over-etching the first nitride film and the pad oxide film by use of an element isolating mask, thereby forming a first hole, a first-nitride film pattern, an anti-reflection film pattern and a pad oxide film pattern; cleaning the entire upper surface of the resulting structure by use of an etch solution; forming second-nitride film spacers on side walls of the first-nitride film pattern, anti-reflection film pattern, pad oxide film pattern and first hole; selectively etching the semiconductor substrate by use of the first-nitride film pattern and second-nitride film spacers as a mask, thereby forming a second hole in the first hole; thermally oxidizing the surface of the second hole, thereby forming a thermal oxide film; and removing the first-nitride film pattern, anti-reflection film pattern, second-nitride film spacers and pad oxide film, thereby forming an element isolating film.

In accordance with another aspect, the present invention provides a method for forming an element isolating film of a semiconductor device comprising the steps of: preparing a semiconductor substrate; sequentially forming a pad oxide film, a first nitride film and an anti-reflection film over the semiconductor substrate; over-etching the first nitride film and the pad oxide film by use of an element isolating mask, thereby forming a first-nitride film pattern, an anti-reflection film pattern and a pad oxide film pattern and forming a first hole in the semiconductor substrate; cleaning the entire upper surface of the resulting structure by use of an etch solution; forming second-nitride film spacers on side walls of the first-nitride film pattern, anti-reflection film pattern, pad oxide film pattern and first hole; thermally oxidizing the surface of the first hole, thereby forming a first thermal oxide film; removing the first thermal oxide film, thereby forming a second hole in the semiconductor substrate; thermally oxidizing the surface of the second hole, thereby forming a second thermal oxide film; and removing the first-nitride film pattern, anti-reflection film pattern, second-nitride film spacers and pad oxide film, thereby forming an element isolating film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 5 to 10 illustrate sequential steps of a method for forming an element isolating insulating film of a semiconductor device in accordance with a first embodiment of the present invention, respectively.

Figure 5:
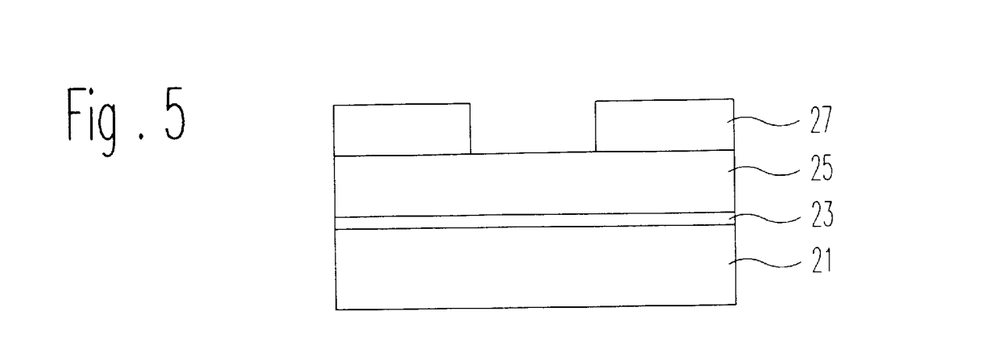
FIGS. 5 to 10 are sectional views respectively illustrating sequential steps of a method for forming an element isolating insulating film of a semiconductor device in accordance with a first embodiment of the present invention.

In accordance with this method, a pad oxide film 23 and a first nitride film 25 are first formed over a semiconductor substrate 21 in a sequential manner, as shown in FIG. 5. A photoresist film pattern 27 is then formed on the first nitride film 25. The pad oxide film 23 has a thickness of about 30 to 150 Å. The first nitride film 25 has a thickness of about 1,500 to 6,000 Å, taking into consideration that it is over-etched in a subsequent anisotropic etch process for forming insulating film spacers.

Figure 6:
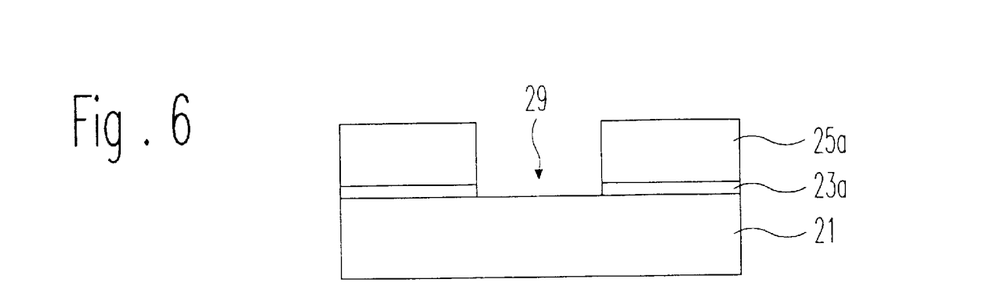

Thereafter, the first nitride film 25 and pad oxide film 23 are sequentially over-etched using the photoresist film pattern 27 as a mask, as shown in FIG. 6. As a result, a first-nitride film pattern 25a and a pad oxide film pattern 23a are formed.

In the over etch process, the semiconductor substrate 21 is also etched to a thickness of about 50 to 150 Å, thereby forming a first hole 29 in the semiconductor substrate 11. The photoresist film pattern 27 is then removed. At this time, an etch residue (not shown) is left in the first hole 29.

Figure 7:
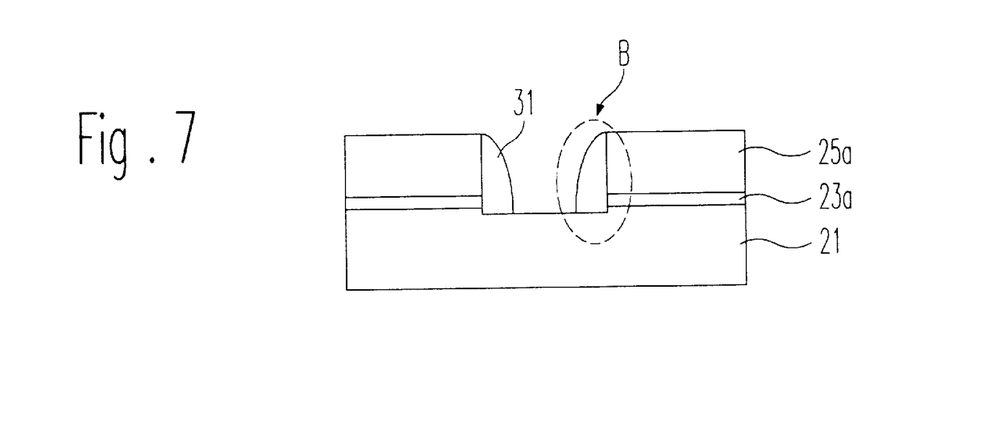

Using a hydrofluorine-based etch solution, the exposed surface of the semiconductor substrate 21 is then cleaned for about 10 to 100 seconds, thereby forming second-nitride film spacers 31 on side walls of the first-nitride film pattern 25a and pad oxide film pattern 23a and first hole 29, as shown in FIG. 7.

The formation of the second-nitride film spacers 31 are achieved by depositing a second nitride film (not shown) to a thickness of about 100 to 800 Å over the structure obtained after the removal of the photoresist film pattern 27, and anisotropically etching the second nitride film without using a mask in such a manner that the first-nitride film pattern 25a maintains a thickness of about 1,500 Å.

The second-nitride film spacers 31 compensates portions of active regions in which bird's beaks may penetrate, thereby preventing a loss of active regions.

Figure 8:
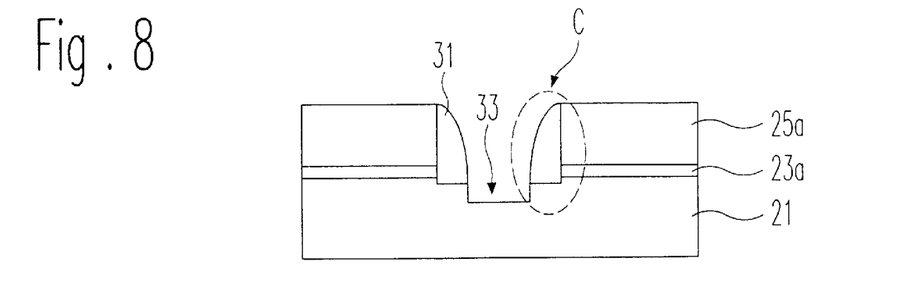

Using the first-nitride film pattern 25a and second-nitride film spacers 31 as a mask, the exposed portion of the semiconductor substrate 21 is then etched to a thickness of about 200 to 500 Å, thereby forming a second hole 33 as shown in FIG. 8.

Where the second hole 33 is excessively deep, the length of the bird's beaks increases undesirably. An element isolating insulating film, which is formed at a subsequent processing step, may also have a level lower than the semiconductor substrate 21. In this case, it is impossible to completely electrically isolate active regions from one another. This results in an increase in leakage current.

Although not shown, an etch residue based on the nitride films is left in the second hole 33 after the completion of the anisotropic etch process. Accordingly, removal of the etch residue is then carried out in a dry removal method.

The dry removal method is performed by an etching device using mixed gas plasma of $CF_4$, $CHF_3$ and Ar. In the mixed gas plasma, the ratio of $CF_4$: $CHF_3$ ranges from 75:65 to 25:35.

Figure 9:
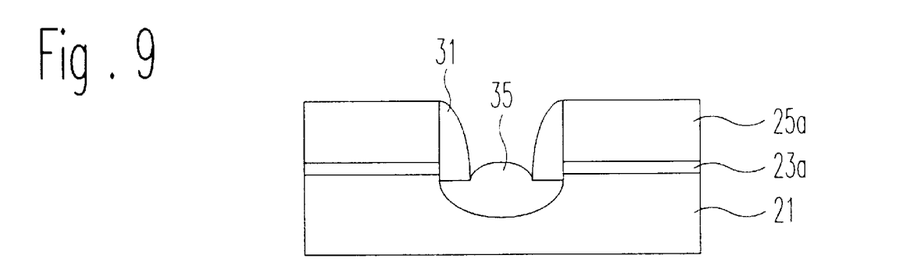

Thereafter, a thermal oxidation process (field oxidation process) is carried out for the exposed portion of the semiconductor substrate 21, thereby forming a thermal oxide film 35 as a field oxide film, as shown in FIG. 9. The thermal oxide film 35 has a thickness of about 2,500 to 3,500 Å.

Where the field oxidation process is carried out without removing the etch residue at the previous processing step, no thermal oxide film is grown at the region where the etch residue is left, it is impossible to form a thermal oxide film having a desired thickness. In this case, there is a degradation in the electrical characteristic of a semiconductor device finally obtained.

Figure 10:
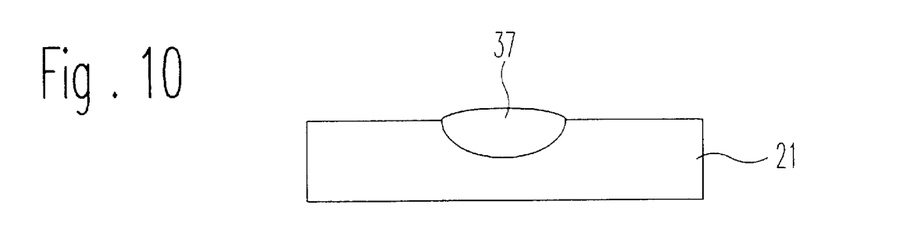

The first-nitride film pattern 25a, second-nitride film spacers 31 and pad oxide film pattern 23a are then removed. Thus, an element isolating insulating film 37 is formed, as shown in FIG. 10.

The processing step of FIG. 7 carried out in a nitride film etching device to form the second-nitride film spacers 31 and the processing step of FIG. 8 carried out in a silicon etching device to form the second hole 33 may be executed in a single etch pass.

Such a single-pass etching step may be carried out in a single etch device while varying etch recipe factors including kinds, ratio and pressures of etch gases and power depending on the etch time.

Figure 11:
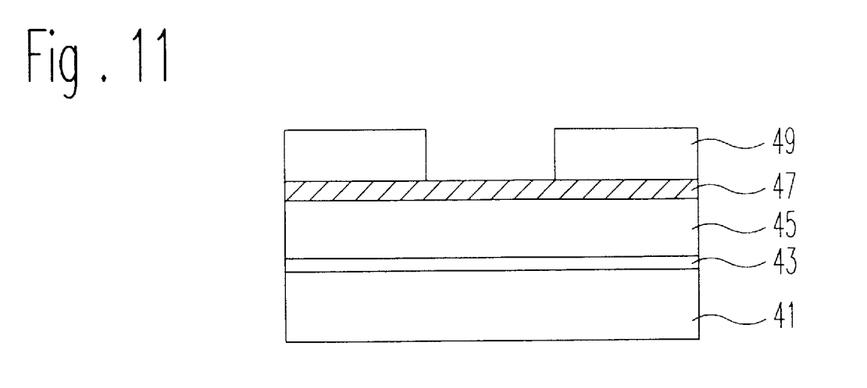
FIG. 11 is a sectional view illustrating a method for forming an element isolating insulating film of a semiconductor device in accordance with a second embodiment of the present invention.

FIG. 11 is a sectional view illustrating a method for forming an element isolating insulating film of a semiconductor device in accordance with a second embodiment of the present invention.

In accordance with this method, a pad oxide film 43 and a first nitride film 45 are first formed over a semiconductor substrate 41 in a sequential manner, as shown in FIG. 11. An oxide-nitride film 47 is then formed overt the first nitride film 45. The pad oxide film 43 has a thickness of about 30 to 150 Å. The first nitride film 45 has a thickness of about 1,500 to 6,000 Å, taking into consideration that it is over-etched in a subsequent anisotropic etch process for forming insulating film spacers. The oxide-nitride film 47 has a thickness of about 100 to 500 Å.

Thereafter, a photoresist film pattern 49 is formed on the oxide-nitride film 47. Through the photoresist film pattern 49, a portion of the semiconductor substrate 41 corresponding to an element isolating region is exposed.

Subsequently, the same processing steps as those of FIGS. 6 to 10 according to the first embodiment of the present invention are carried out, thereby forming an element isolating insulating film (not shown) having a planarized upper surface structure while being formed with small bird's beaks.

In the process of the above processing steps, the oxide-nitride film 47 delays a loss of the first-nitride film pattern (not shown) occurring at the anisotropically etching step for the formation of the second-nitride film spacers (not shown), thereby correspondingly increasing the thickness of the first-nitride film pattern (not shown) left in the active regions. That is, the oxide-nitride film 47 serves to suppress the formation of bird's beaks.

The oxide-nitride film 47 also serves as an anti-reflection film at the step of forming the photoresist film 49.

Figure 12:
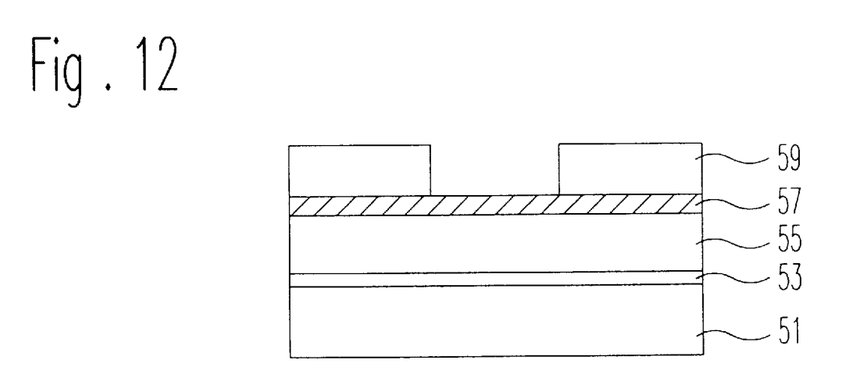
FIG. 12 is a sectional view illustrating a method for forming an element isolating insulating film of a semiconductor device in accordance with a third embodiment of the present invention.

FIG. 12 is a sectional view illustrating a method for forming an element isolating insulating film of a semiconductor device in accordance with a third embodiment of the present invention.

In accordance with this method, a pad oxide film 53 and a first nitride film 55 are first formed over a semiconductor substrate 51 in a sequential manner, as shown in FIG. 12. An oxide film 57 is then formed over the first nitride film 55 in accordance with a chemical vapor deposition (CVD) method. The pad oxide film 53 has a thickness of about 30 to 150 Å whereas the first nitride film 55 has a thickness of about 1,500 to 6,000 Å, taking into consideration that it is over-etched in a subsequent anisotropic etch process for forming insulating film spacers. The CVD oxide film 57 has a thickness of about 100 to 500 Å.

Thereafter, a photoresist film pattern 59 is formed on the CVD oxide film 57 in such a manner that a portion of the semiconductor substrate 51 corresponding to an element isolating region is exposed through the photoresist film pattern 59.

Subsequently, the same processing steps as those of FIGS. 6 to 10 according to the first embodiment of the present invention are carried out, thereby forming an element isolating insulating film (not shown) having a planarized upper surface structure while being formed with small bird's beaks.

During the above processing steps, the CVD oxide film 57 delays a loss of the first-nitride film pattern (not shown) occurring at the anisotropically etching step for the formation of the second-nitride film spacers (not shown), thereby correspondingly increasing the thickness of the first-nitride film pattern (not shown) left in the active regions. That is, the CVD oxide film 57 serves to suppress the formation of bird's beaks. The CVD oxide film 57 also serves as an anti-reflection film at the step of forming the photoresist film 59.

Figure 13:
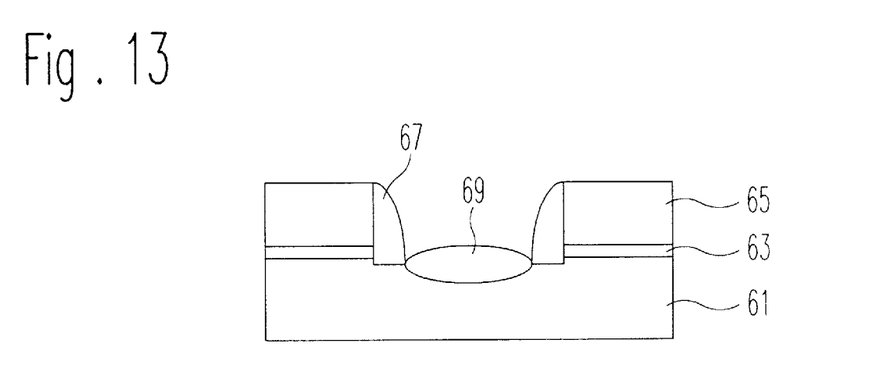
FIGS. 13 and 14 are sectional views respectively illustrating a method for forming an element isolating insulating film of a semiconductor device in accordance with a fourth embodiment of the present invention.
Figure 14:
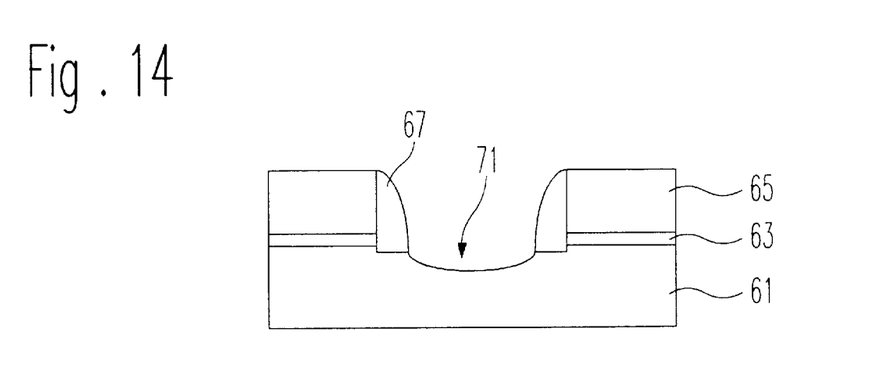

FIGS. 13 and 14 are sectional views respectively illustrating a method for forming an element isolating insulating film of a semiconductor device in accordance with a fourth embodiment of the present invention.

In accordance with this method, the same processing steps as those of FIGS. 5 to 7 according to the first embodiment of the present invention are carried out, thereby forming a structure shown in FIG. 13.

Thereafter, a thermal oxidation process is carried out for the exposed portion of the semiconductor substrate 61 at a temperature of about 800 to 1,100° C., thereby forming a first thermal oxide film 69 having a thickness of about 200 to 1,000 Å as shown in FIG. 13.

The first thermal oxide film 69 is then removed using a hydrofluorine-based etch solution. Thus, a second hole 71 having thickness of about 100 to 500 Å corresponding to about half the thickness of the first thermal oxide film 69 is formed in the exposed portion of the semiconductor substrate 61, as shown in FIG. 14.

Subsequently, the same steps as the steps of FIGS. 9 and 10 are carried out, thereby forming an element isolating insulating film (not shown) in the second hole 71.

In accordance with another embodiment of the present invention, the formation of the element isolating insulating film may be achieved by forming an oxide-nitride film or CVD oxide film between the first nitride film and photoresist film pattern as in the second or third embodiment, and carrying out the subsequent processing step as in the fourth embodiment.

Figure 15:
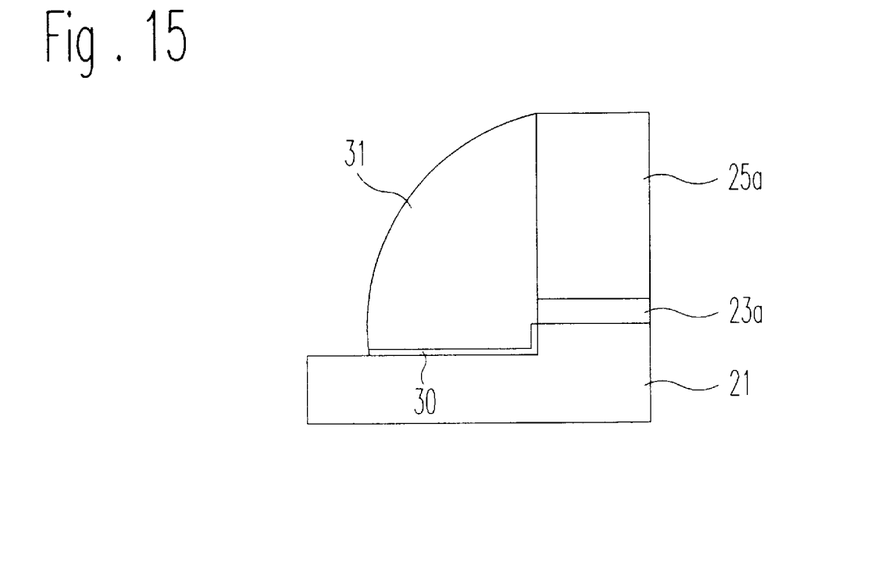
FIG. 15 is an enlarged sectional view of the portion "B" of FIG. 7 where no cleaning step is carried out for the structure of FIG. 6.

FIG. 15 is an enlarged sectional view of the portion "B" of FIG. 7 where no cleaning step is carried out for the structure of FIG. 6.

In this case, a natural oxide film 30 is formed on the exposed surface portion of the semiconductor substrate 21 because the cleaning step using the hydrofluorine-based etch solution is not carried out. Under this condition, the formation of second nitride film spacers 31 are formed on side walls of the mad oxide film pattern 23a, first-nitride film pattern 25a and first hole 29.

In this case, the natural oxide film 30 serves to promote the growth of bird's beaks during the subsequent thermal oxidation process, thereby reducing the active regions. As a result, it is difficult to fabricate a highly integrated semiconductor device.

Figure 16:
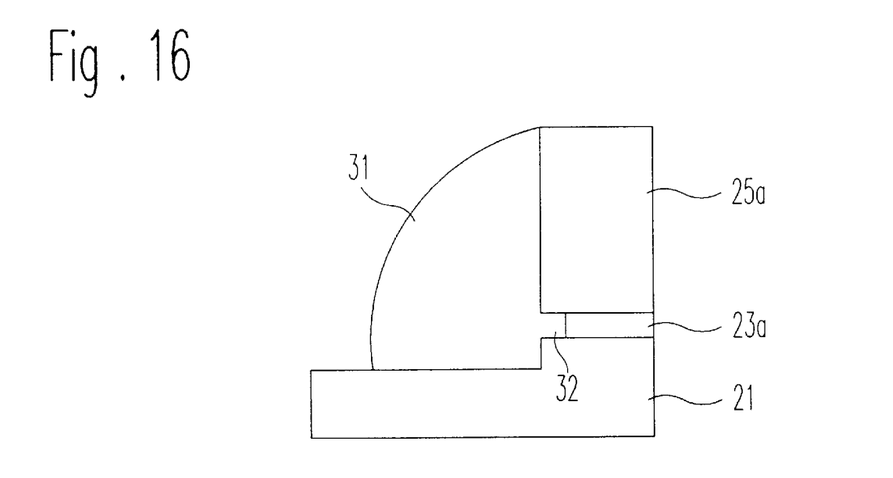
FIG. 16 is an enlarged sectional view of the portion "B" of FIG. 7 where a cleaning step is carried out for the structure of FIG. 6 in accordance with the present invention.

FIG. 16 is an enlarged sectional view of the portion "B" of FIG. 7 where a cleaning step is carried out for the structure of FIG. 6 in accordance with the present invention.

Using a hydrofluorine-based etch solution, a lateral etch process is carried out for at least 100 seconds for the pad oxide film pattern 23a as well as the natural oxide film 30 of FIG. 15, thereby forming undercuts 32. Thereafter, the second-nitride film spacers 31 are formed on the pad oxide film pattern 23a, first-nitride film pattern 25a and first hole 29.

During the formation of the second-nitride film spacers 31, the second nitride film buries the undercuts 32. Where the formation of the element isolating insulating film is carried out under this condition, the second-nitride film spacers 31 burying the undercuts 32 depresses the semiconductor substrate 21. As a result, defects (not shown) are formed.

Figure 17:
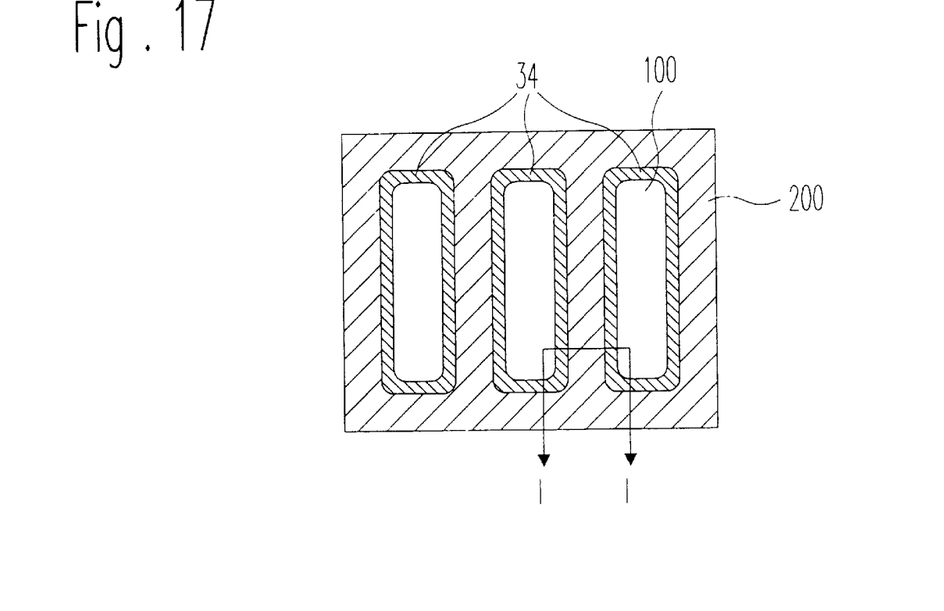
FIG. 17 is a plan view illustrating an element isolating insulating film which has defects at its portions respectively corresponding to the edges of active regions due to the use of the process of FIG. 16.

FIG. 17 is a plane view illustrating an element isolating insulating film 37 which has defects 34 at its portions respectively corresponding to the edges of the active regions due to the use of the process of FIG. 16.

In FIG. 17, the reference numeral "100" denotes active regions defined on the semiconductor substrate 21 whereas the reference numeral "200" denotes an element isolation region defined on the semiconductor substrate 21. The reference numeral "34" denotes defects formed on the edges of the active regions 100.

Figure 18:
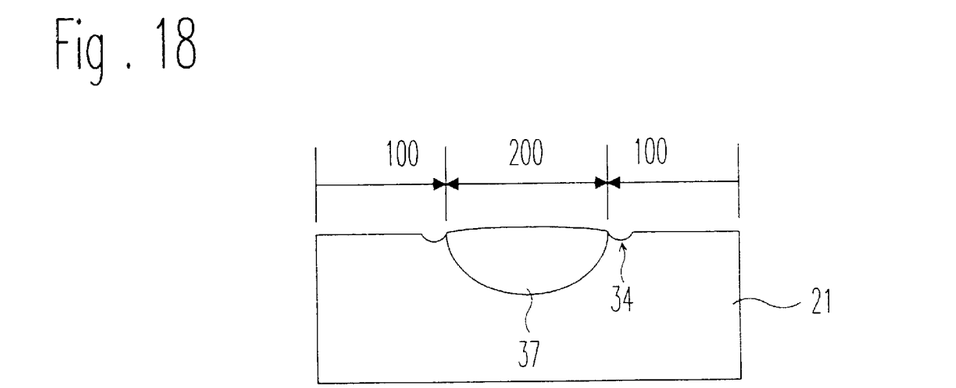
FIG. 18 is a cross-sectional view taken along the line I—I of FIG. 17.

FIG. 18 is a cross-sectional view taken along the line I—I of FIG. 17. Referring to FIG. 18, the defects 34 are formed on the portions of the active regions 100 disposed adjacent to the element isolating insulating film 37.

Figure 19:
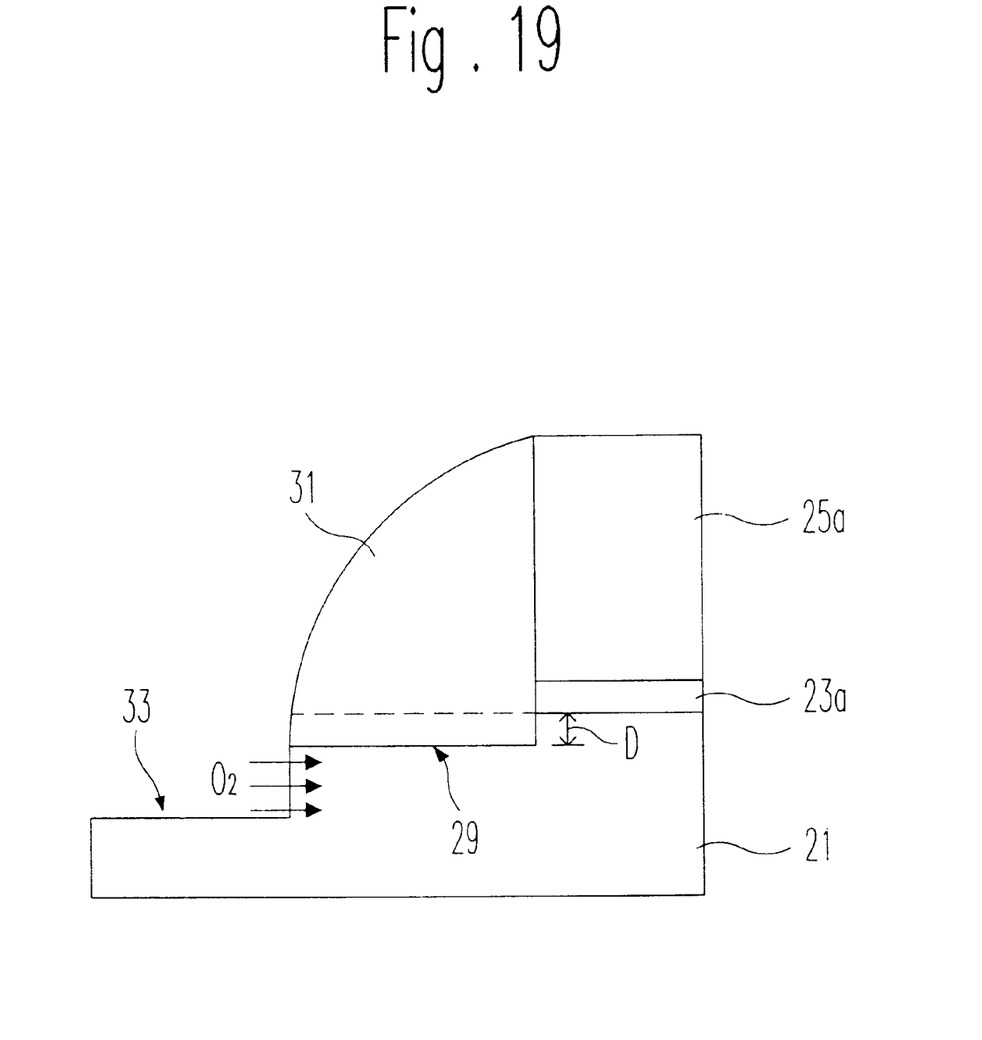
FIG. 19 is an enlarged sectional view of the portion "C" of FIG. 8.

In contrast, FIG. 19 is an enlarged sectional view of the portion "C" of FIG. 8. FIG. 19 explains the principle of suppressing the formation of the bird's beaks, when the formation of the thermal oxide film 35 of FIG. 9 is carried out, by performing the over-etch process of FIG. 7.

As shown in FIG. 19, the first hole 29 is formed to have a depth D. Accordingly, the migration length increases by an increase in the thickness of the second-nitride film spacers 31, thereby further suppressing the growth of bird's beaks occurring in the thermal oxidation process.

As is apparent from the above description, the method of the present invention provides various effects.

That is, the method of the present invention effectively prevents the formation of bird's beaks, as compared to the conventional LOCOS techniques. Accordingly, it is possible to obtain wide active regions.

The method of the present invention also provides a superior planarization corresponding to a volume ratio of about 90% or more. Accordingly, it is possible to prevent an irregular reflection of light from the element isolating insulating film, thereby preventing a notching phenomenon.

In accordance with the present invention, an increase in volume ratio is also achieved. Such an increase in volume ratio results in an increase in punch-though voltage. Accordingly, it is possible to improve the electrical characteristic, operation characteristic, reliability and yield of semiconductor devices.

Consequently, the method for forming an element isolating insulating film of a semiconductor device in accordance with the present invention is proper for the fabrication of highly integrated semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming an element isolating film of a semiconductor device, comprising:
   providing a semiconductor substrate;
   sequentially forming a pad oxide film, a first nitride film and an anti-reflection film over the semiconductor substrate;
   over-etching the first nitride film and the pad oxide film using an element isolating mask, thereby forming a first nitride film pattern, an anti-reflection film pattern and a pad oxide film pattern and forming a first hole in the semiconductor substrate;
   cleaning the entire upper surface of the resulting structure using an etch solution;
   forming second nitride film spacers on side walls of the first nitride film pattern, the anti-reflective film pattern, the pad oxide film pattern and the first hole;
   thermally oxidizing the surface of the first hole, thereby forming a first thermal oxide film;
   removing the first thermal oxide film, thereby forming a second hole in the semiconductor substrate;
   thermally oxidizing the surface of the second hole, thereby forming a thermal oxide film; and
   removing the first nitride film pattern, the anti-reflection film pattern, the second nitride film spacers and the pad oxide film, thereby forming the element isolating film.

2. The method in accordance with claim 1, wherein:
   anti-reflection film includes an oxynitride film.

3. The method in accordance with claim 1, wherein:
   the anti-reflection film includes a chemical vapor deposition oxide film.

4. The method in accordance with claim 1, wherein:

the anti-reflective film has a thickness of about 100 to 500 Å;

the first nitride film has a thickness of about 1,500 to 6,000 Å;

the first hole has a depth of about 50 to 150 Å; and the second hole has a depth of about 100 to 500 Å.

5. The method in accordance with claim 1, wherein:

the cleaning step is carried out for about 10 to 100 seconds.

6. The method in accordance with claim 1, further comprising:

removing an etch residue left in the second hole after the formation of the second hole.

7. The method in accordance with claim 1, wherein:

the thermal oxidation step for forming the first thermal oxide film is carried out at a temperature of about 800 to 1,100° C.

* * * * *